(12) United States Patent
Lee

(10) Patent No.: US 7,348,724 B2
(45) Date of Patent: Mar. 25, 2008

(54) ORGANIC ELECTROLUMINESCENCE DEVICE WITH SHORT-PREVENTION LAYER

(75) Inventor: Ho Nyun Lee, Seoul (KR)

(73) Assignee: LG Electronics, LLP, Seoul (KR)

( * ) Notice: Subject to any disclaimer, the term of this patent is extended or adjusted under 35 U.S.C. 154(b) by 352 days.

(21) Appl. No.: 11/000,077

(22) Filed: Dec. 1, 2004

(65) Prior Publication Data
US 2005/0116628 A1 Jun. 2, 2005

(30) Foreign Application Priority Data
Dec. 2, 2003 (KR) .................. 10-2003-0086832

(51) Int. Cl.
*H01J 1/62* (2006.01)
*H01J 63/04* (2006.01)
(52) U.S. Cl. .................. 313/504; 313/498; 313/506
(58) Field of Classification Search .......... 313/498, 313/504, 506, 512
See application file for complete search history.

(56) References Cited

U.S. PATENT DOCUMENTS

| 6,831,408 | B2 * | 12/2004 | Hirano et al. ........... 313/504 |
| 2002/0187367 | A1 * | 12/2002 | Sakaguchi ............... 428/690 |
| 2003/0011301 | A1 * | 1/2003 | Sasaoka et al. ......... 313/506 |
| 2003/0062519 | A1 | 4/2003 | Yamazaki et al. ....... 257/40 |
| 2003/0129298 | A1 | 7/2003 | Tera et al. ............... 427/66 |
| 2004/0119403 | A1 * | 6/2004 | McCormick et al. ... 313/506 |
| 2005/0012450 | A1 * | 1/2005 | Shinohara et al. ...... 313/504 |

FOREIGN PATENT DOCUMENTS

| JP | 08-140106 | | 5/1996 |
| JP | 10-275683 | | 10/1998 |
| JP | 11-054287 | | 2/1999 |
| JP | 11054287 A | * | 2/1999 |
| JP | 11-339969 | | 12/1999 |
| JP | 2004-127609 | | 4/2004 |
| KR | 2003-0074457 | | 9/2003 |

OTHER PUBLICATIONS

Korena Office Action dated Oct. 21, 2005.
European Search Report dated Jun. 28, 2006.
Korean Office Action.

* cited by examiner

*Primary Examiner*—Mariceli Santiago
*Assistant Examiner*—Kevin Quarterman
(74) *Attorney, Agent, or Firm*—Ked & Associates, LLP

(57) ABSTRACT

The present invention provides an organic EL device, by which an anode and cathode are prevented from being short-circuited in case of an emitting cell is blown out. The present invention includes an anode on a substrate, an organic layer on the anode, a cathode on the organic layer, and a short-prevention layer having a tensile stress on the cathode.

8 Claims, 3 Drawing Sheets

ORGANIC ELECTROLUMINESCENCE DEVICE WITH SHORT-PREVENTION LAYER

This application claims the benefit of the Korean Application No. 10-2003-0086832 filed on Dec. 2, 2003, which is hereby incorporated by reference.

BACKGROUND OF THE INVENTION

1. Field of the Invention

The present invention relates to an organic electroluminescence device, by which an anode and cathode are prevented from being short-circuited in case of an emitting cell is blown out.

2. Discussion of the Related Art

Generally, an organic electroluminescence (hereinafter abbreviated EL) device using electroluminescence of an organic material has a structure that an organic hole transport layer or organic luminescent layer is inserted between upper and lower electrodes.

Many efforts are made to research and development for the organic EL device capable of high brightness luminescence by a DC drive of low voltage.

Specifically, a bottom emission type organic EL device, as shown in FIG. 1, consists of an anode 12 on a substrate 11, an organic layer 13 on the anode 12, and a cathode 14 on the organic layer 13.

The organic layer 13 is configured with at least one layer formed of an organic material.

For example, the organic layer 13 consists of a hole injection layer (HIL) 13a, a hole transport layer (HTL) 13b, an emitting layer 13c, and an electron transport layer 13d.

The cathode 14 is operative in injecting electrons and reflecting an emitted light. The anode 12 is formed of a transparent material such as ITO (indium tin oxide).

In the above-configured organic EL device, if the anode 12 and cathode 14 are connected to positive and negative terminals of a DC power, respectively, holes injected from the hole injection layer 13a move to the emitting layer 13c via the hole transport layer 13b.

Meanwhile, electrons injected from the cathode 14 move to the emitting layer 13c via the electron transport layer 13d.

Hence, the electrons and holes having moved to the emitting layer 13c are coupled to each other to emit light.

The light, as indicated by an arrow in the drawing), emitted from the emitting layer 13c is directly discharged outside via the cathode 12. And, the light emitted in a direction of the cathode is reflected on the cathode 14 to be discharged outside via the anode 12.

Thus, the cathode 14 of the organic EL device is operative in injecting electrons, reflecting light, and reducing resistance.

Yet, in case that an emitting cell, as shown in FIG. 2, is blown out by internal and/or external stresses, the cathode 14 is bent toward the organic layer 13.

Moreover, heat generated from the explosion of the emitting cell may melt the cathode 14 down in a direction of the anode 12. Hence, it is highly probable that the bent cathode 14 can be short-circuited with the anode 12.

The organic devices are generally categorized into active matrix devices and passive matrix devices.

However, since the short circuit occurrence between the cathode 14 and the anode 12 causes a dead pixel in the active matrix device, a short-occurring pixel becomes unusable.

Besides, since the short circuit occurrence causes line failure in the passive matrix device, a line including the shorted pixel becomes unusable.

Therefore, the shorted cathode and anode lowers reliability of the organic EL device.

SUMMARY OF THE INVENTION

Accordingly, the present invention is directed to an organic electroluminescence (EL) device that substantially obviates one or more problems due to limitations and disadvantages of the related art.

An object of the present invention is to provide an organic EL device, by which an anode and cathode are prevented from being short-circuited in case of an emitting cell is blown out.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic EL device according to the present invention includes an anode on a substrate, an organic layer on the anode, a cathode on the organic layer, and a short-prevention layer having a tensile stress on the cathode.

Preferably, the short-prevention layer is formed of metal having high thermal conductivity.

Preferably, the short-prevention layer is formed of either one selected from the group consisting of Cr, Mo, Ni, Ti, Co, Ag, Au, Al, Pt, and Pd or an alloy of at least two selected from the group.

Preferably, the short-prevention layer is formed of a material having a melting point higher than that of the cathode.

Preferably, the short-prevention layer is formed by resistance heating.

Preferably, the short-prevention layer is formed by either E-beam processing.

Preferably, the short-prevention layer is formed by sputtering.

Preferably, the short-prevention layer is formed at a temperature within a range leaving the organic layer intact.

More preferably, the temperature is equal to or lower than 80° C.

More preferably, the short-prevention layer is formed by the sputtering at a pressure of 0.5~10 mTorr, a power density of 0.1~8 W/cm$^2$, and a substrate bias of (−)500~0V.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
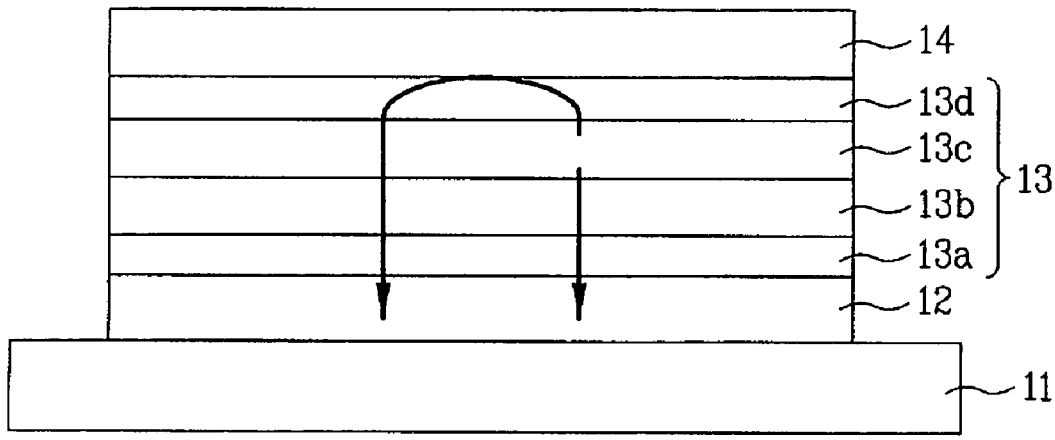
FIG. 1 is a cross-sectional diagram of an organic EL device according to a related art.
Figure 2:
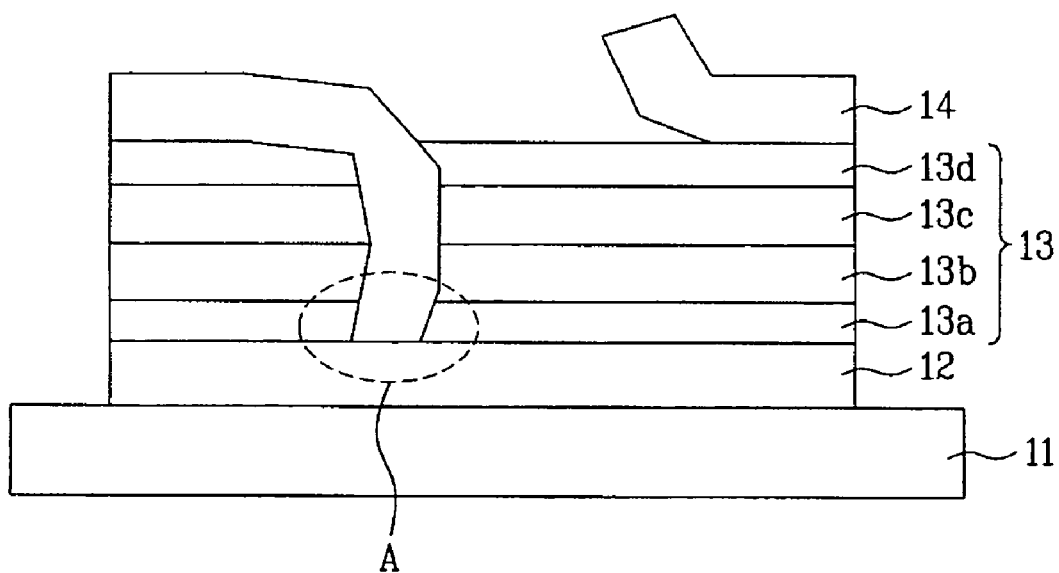
FIG. 2 is a cross-sectional diagram of a cathode of an organic EL device according to a related art in case of having a blown-out emitting cell.
Figure 3:
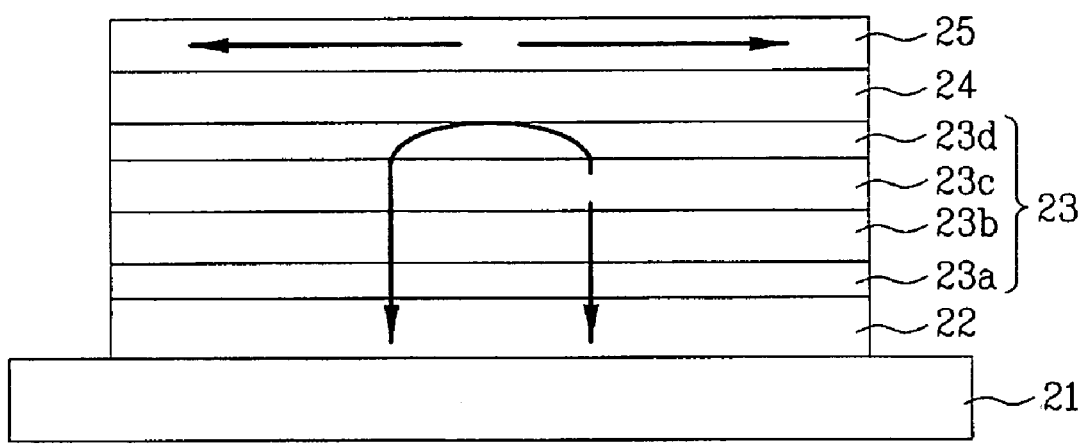
FIG. 3 is a cross-sectional diagram of an organic EL device according to the present invention.

FIG. 3 is a cross-sectional diagram of an organic EL device according to the present invention.

Referring to FIG. 3, an organic EL device according to the present invention includes an anode 22 on a substrate 21, an organic layer 23 on the anode 22, a cathode 24 on the organic layer 23, and a short-prevention layer 25 having a tensile stress on the cathode 24.

The organic layer 23 is configured with at least one layer formed of an organic material.

For instance, the organic layer 23 includes a hole injection layer (HIL) 23a, a hole transport layer (HTL) 23b, an emitting layer 23c, and an electron transport layer (ETL) 23d, which are sequentially stacked on the anode 22.

The cathode 24 is operative in injecting electrons, reflecting light emitted from the emitting layer 23c in a direction of the substrate 21, and reducing resistance.

In doing so, the tensile stress is additionally provided to the stacked layer configured with the cathode 24 and the short-prevention layer 25 as well as the foresaid roles of the related art cathode. Hence, it can be said that the stacked layer configured with the cathode 24 and the short-prevention layer 25 is an extended cathode.

And, the short-prevention layer 25 is formed of one of Cr, Mo, Ni, Ti, Co, Ag, Au, Al, Pt, Pd, and the like or an alloy consisting of at least two selected from the group consisting of Cr, Mo, Ni, Ti, Co, Ag, Au, Al, Pt, Pd, etc.

Moreover, the short-prevention layer 25 is formed by resistance heating, E-beam processing, or sputtering.

In case of forming the short-prevention layer 25 by sputtering, the ranges of pressure, power density, substrate bias, and temperature should be appropriately set up not to cause damage to the organic layer 23.

As a result of test, the above sputtering is preferably carried out at the pressure of 0.5~10 mTorr, power density of 0.1~8 W/cm$^2$, substrate bias of (−)500~0V, and temperature equal to or lower than 80° C.

Once the short-prevention layer 25 is formed on the cathode 24, the tensile stress of the short-prevention layer 25 affects the cathode 24 underneath.

Figure 4:
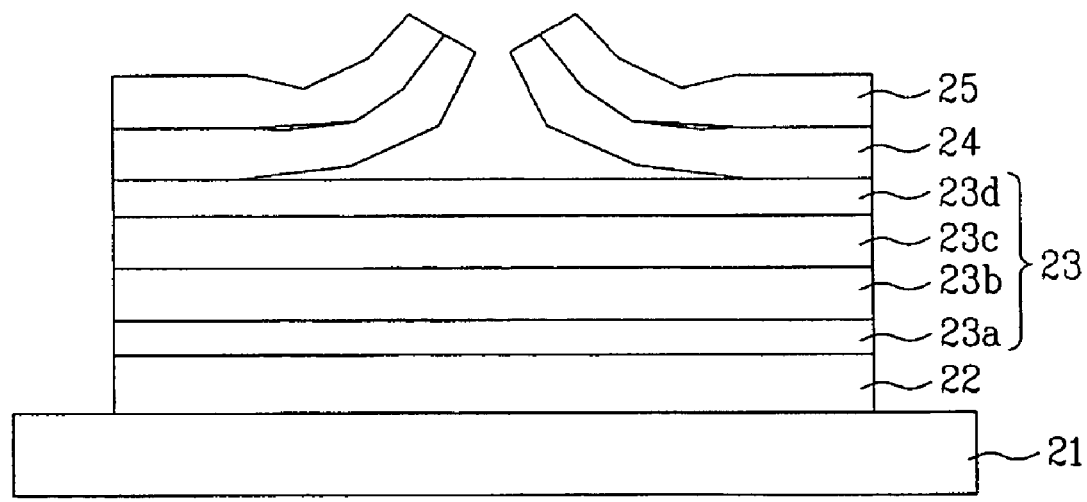
FIG. 4 is a cross-sectional diagram of a cathode of an organic EL device according to the present invention in case of having a blown-out emitting cell.

FIG. 4 is a cross-sectional diagram of a cathode of an organic EL device according to the present invention in case of having a blown-out emitting cell.

Referring to FIG. 4, in case that an emitting cell is blown out by internal and/or external stresses, the cathode 24 is bent in a direction opposite to the organic layer 23 due to the tensile stress of the short-prevention layer 25.

Hence, it is able to prevent the anode 22 and cathode 24 from being shorted with each other.

Once the cathode 24 is bent in the direction opposite to the organic layer 23 due to the tensile stress of the short-prevention layer 25, a predetermined gap is naturally provided over the organic layer 23. Hence, heat generated from the explosion of the emitting cell can dissipate quickly via the gap.

As the internal heat is externally dissipated, the cathode 24 is prevented from being melted by the heat generated from the explosion of the emitting cell. Hence, the cathode 24 can avoid contacting with the anode 22 or causing damage to the organic layer 23.

Moreover, the tensile stress of the short-prevention layer 25 affects the cathode 24 to suppress hillock formation occurring in the cathode 24.

Therefore, the problems of the dead pixel, dark spot, line failure, and the like can be solved.

Meanwhile, the variation of the tensile stress according to a deposition condition of the short-prevention layer 25 is taken into consideration as follows, in which the short-prevention layer 25 is formed of Cr for example.

Figure 5A:
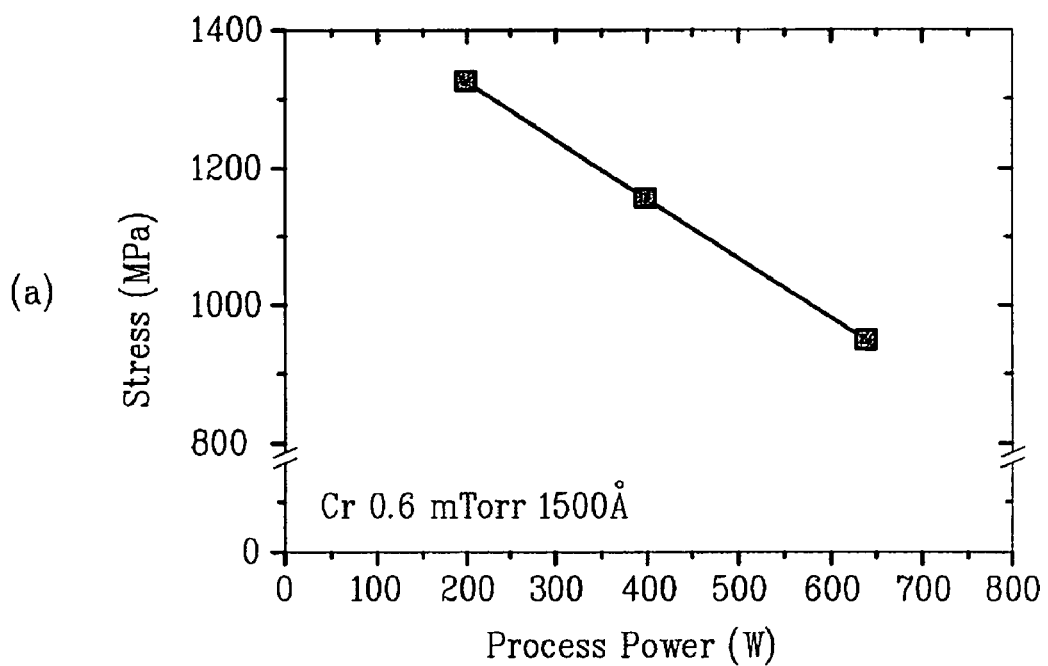
FIG. 5A and FIG. 5B are graphs of tensile stress variations of a substrate according to power and pressure in depositing a Cr layer at the room temperature.
Figure 5B:
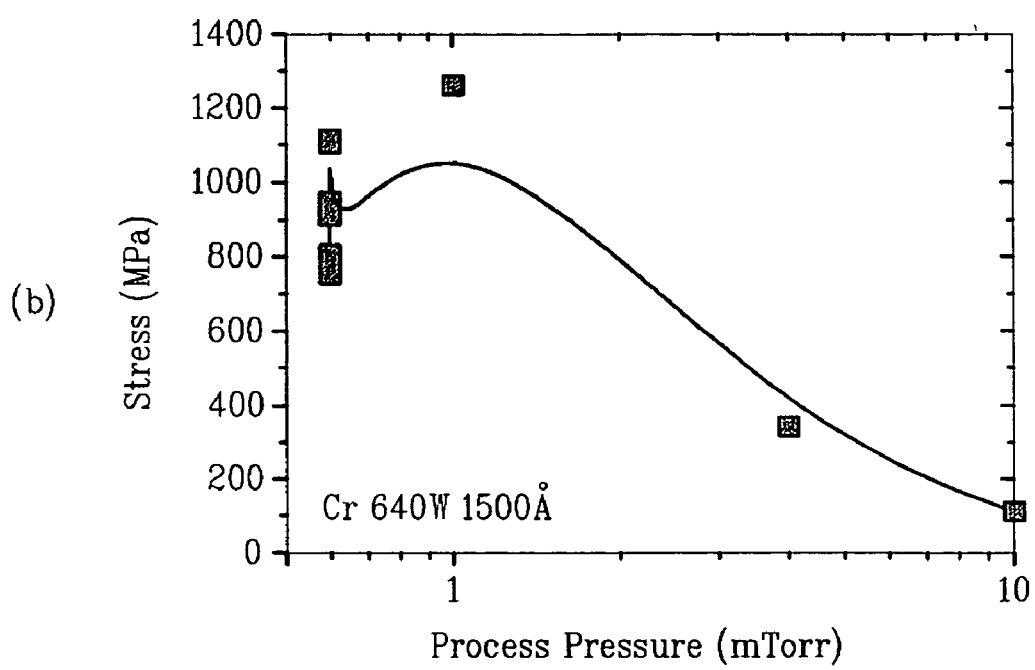

FIG. 5A and FIG. 5B are graphs of tensile stress variations of a substrate according to power and pressure in depositing a Cr layer at the room temperature, for which DC magnetron sputter equipments are used.

Namely, a Cr layer is deposited about 1,500 Å thick on a silicon substrate suing DC magnetron sputter equipments. And, curvatures of the substrate are measured prior to and after the Cr layer deposition to calculate a stress.

Referring to FIG. 5A, a tensile stress is 1.3 Gpa at a process power of 200 W and Ar ambience of 0.6 mTorr. Yet, the tensile stress is equal to or smaller than 1 Gpa at the process power of 600 w.

Hence, it can be confirmed that the tensile stress is inverse proportional to the process power.

Referring to FIG. 5B, the tensile stress temporarily increases but then decreases according to the pressure increment to 10 mTorr from 0.6 mtorr at the room temperature with a fixed power of 640 W.

In depositing a layer, a compression stress is generally converted to a tensile stress in case of raising a pressure or in case of lowering a deposition power.

Such a general principle corresponds to the result of the test data in FIG. 5A and FIG. 5B in aspect of the power variation only, but fails to correspond to the same result in aspect of the pressure variation.

The inconsistency between the test result and the general principle is attributed to the intrinsic property of Cr used as the short-prevention layer. By the way, the test result, which has similarity to the result disclosed in A. Misra et al., is reliable.

By considering the Cr layer has a wide window having the tensile stress, an organic EL device is substantially fabricated using the Cr layer as the short-prevention layer.

As a result of fabricating the organic El device having the short-prevention layer provided thereto, the number of dark spots of the organic EL device of the present invention is reduced to a half of that of the related art. And, an initial line failure occurrence time of the present invention is enhanced from 520 hours to 1,000 hours, which is twice longer than that of the related art.

The test result explains the aforesaid usefulness of the short-prevention layer. Namely, in case that the emitting cell is partially blown out, the cathode 24 becomes simply cut open not to be easily shorted with the anode 22 and the internal heat is efficiently dissipated outside.

Moreover, the short-prevention layer suppresses the formation of hillock.

Besides, adhesiveness between the cathode 24 and the anode 23 is enhanced by the physical energy of Cr atom on depositing the short-prevention layer.

Meanwhile, any material, which has a melting point higher than that of the cathode 24 and enables the short-prevention layer 25 to have the tensile stress under the aforesaid conditions, can be used as a raw material of the short-prevention layer 25.

Preferably, the short-prevention layer 25 is formed of metal having high heat conductivity with facilitation of its deposition.

Besides, a material having a high melting point is effective to sustain a shape instead of being melted in case of the explosion of the emitting cell.

Accordingly, the present invention provides the following effects or advantages.

First of all, in case of the explosion of the emitting cell, the cathode is bent in the direction opposite to the anode due to the tensile stress of the short-prevention layer. Hence, the probability of the short occurrence between the cathode and the anode is lowered and the generated heat can be dissipated via the gap provided by the bent cathode.

Therefore, the problems of the dead pixel, dark spot, line failure, and the like can be solved.

Secondly, the short-prevention layer having the tensile stress can reduce the hillock occurrence in the cathode.

Thirdly, since the short-prevention layer is formed of the material having the melting point higher than that of the cathode, the cathode is less melted in case of the explosion of the emitting cell to lower the probability of the short occurrence between the cathode and the anode.

Finally, adhesiveness between the cathode and the anode is enhanced by the physical energy of Cr atom on depositing the short-prevention layer, whereby a device lifetime is elongated.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic EL device comprising:
   an anode on a substrate;
   an organic layer on the anode;
   a cathode on the organic layer; and
   a short-prevention layer having a tensile stress on the cathode,
   wherein the short-prevention layer is formed of either one selected from the group consisting of Cr, Mo, Ti, Co, Pt, or Pd or an alloy of at least two selected from the group, and wherein the short-prevention layer has a melting point higher than that of the cathode, wherein the short-prevention layer is formed of metal having a thermal conductivity sufficient to dissipate heat at a predetermined rate.

2. The organic EL device of claim 1, wherein the short-prevention layer is formed of a material having a melting point higher than that of the cathode.

3. The organic EL device of claim 1, wherein the short-prevention layer is formed by resistance heating.

4. The organic EL device of claim 1, wherein the short-prevention layer is formed by E-beam processing.

5. The organic EL device of claim 1, wherein the short-prevention layer is formed by sputtering.

6. The organic EL device of claim 5, wherein the short-prevention layer is formed by the sputtering at a pressure of 0.5~10 mTorr, a power density of 0.1~8 W/cm$^2$, and a substrate bias of (−)500~0V.

7. The organic EL device of claim 1, wherein the short-prevention layer is formed at a temperature within a range leaving the organic layer intact.

8. The organic EL device of claim 6, wherein the temperature is equal to or lower than 80° C.

* * * * *